United States Patent
Chaparala et al.

(10) Patent No.: US 7,170,090 B1
(45) Date of Patent: Jan. 30, 2007

(54) METHOD AND STRUCTURE FOR TESTING METAL-INSULATOR-METAL CAPACITOR STRUCTURES UNDER HIGH TEMPERATURE AT WAFER LEVEL

(75) Inventors: Prasad Chaparala, Sunnyvale, CA (US); Barry O'Connell, Palo Alto, CA (US); Jonggook Kim, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/929,209

(22) Filed: Aug. 30, 2004

Related U.S. Application Data

(60) Provisional application No. 60/505,388, filed on Sep. 24, 2003.

(51) Int. Cl.
*H01L 29/10* (2006.01)
*G01R 31/26* (2006.01)
*H01L 21/66* (2006.01)

(52) U.S. Cl. .................. 257/48; 257/E21.524; 324/765
(58) Field of Classification Search .................. 257/48, 257/E21.524
See application file for complete search history.

(56) References Cited

U.S. PATENT DOCUMENTS 6,344,964 B1 * 2/2002 Adler ...................... 361/306.3
2003/0116823 A1 * 6/2003 Yoneda ...................... 257/577

* cited by examiner

*Primary Examiner*—Long Tran
(74) *Attorney, Agent, or Firm*—Stallman & Pollock LLP

(57) ABSTRACT

A test structure and a test methodology are provided for testing metal-insulator-metal (MIM) capacitor structures under high temperatures at the wafer level. The test structure includes a resistor formed on a region of dielectric isolation material formed in a semiconductor substrate. The MIM capacitor is formed over the resistor and separated therefrom by dielectric material. A metal thermometer, formed from the same material as the plates of the MIM capacitor, is placed above the resistor and in close proximity to the capacitor. High current is forced through the resistor, causing both the metal thermometer and the MIM capacitor to heat up along with the resistor. The change in resistance of the metal thermometer is monitored. Using the known temperature coeffecient of resistance (TCR) for the metal used to form both the capacitor and the thermometer, changes in the measured resistance of the metal thermometer are converted to temperature.

4 Claims, 1 Drawing Sheet

METHOD AND STRUCTURE FOR TESTING METAL-INSULATOR-METAL CAPACITOR STRUCTURES UNDER HIGH TEMPERATURE AT WAFER LEVEL

RELATED APPLICATION

The present application claims the benefit of U.S. Provisional Patent Application No. 60/505,388, filed Sep. 24, 2003.

TECHNICAL FIELD

The present invention is directed to a test method and structure that significantly improves the test time and reduces the cost of reliability testing of Metal-Insulator-Metal (MIM) capacitors that are widely used in advanced CMOS and BiCMOS integrated circuits.

DESCRIPTION OF THE INVENTION

Figure 1:
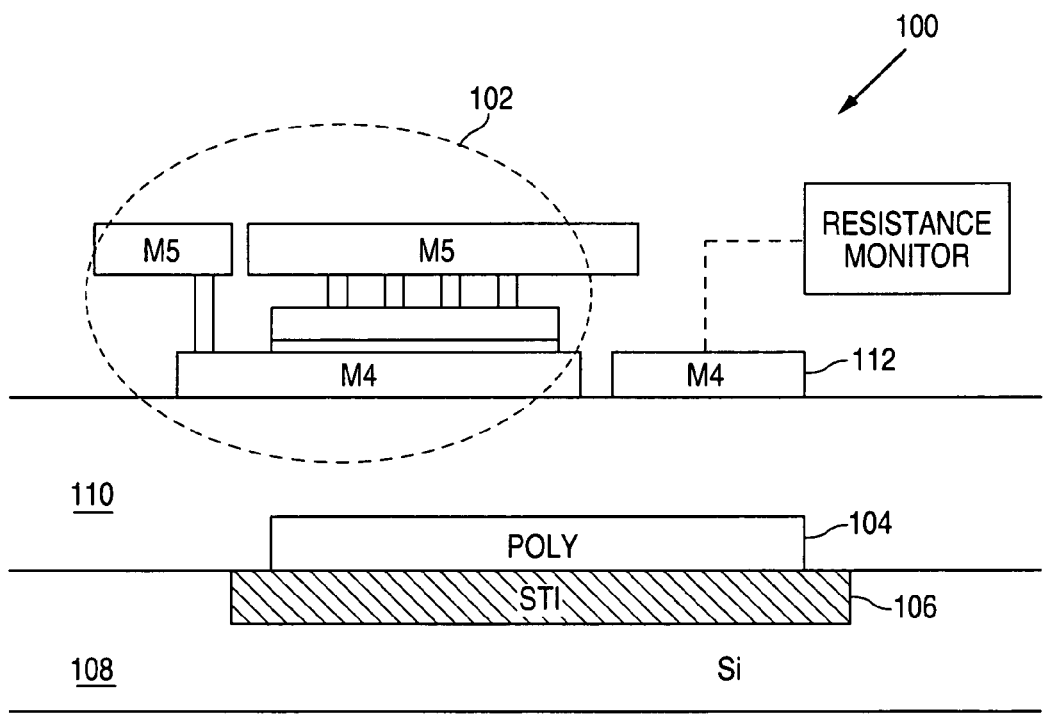
FIG. 1 is a partial cross section drawing illustrating an embodiment of a test structure that may be utilized for practicing a MIM capacitor testing method in accordance with the concepts of the present invention.

Metal-Insulator-Metal (MIM) capacitors are used in analog and RF/mixed signal processes for decoupling and filtering applications, for example. These capacitors are becoming increasingly popular in analog applications because of their superior linearity characteristics with voltage and temperature.

However, the long-term reliability of MIM capacitors is a serious concern. Currently, reliability testing of MIM capacitors is conducted under accelerated stress conditions to estimate the lifetime of these devices at use conditions. The typical reliability test methodology to obtain this information involves packaging of integrated circuit die samples and performing "burn-in" tests in high temperature ovens for periods of more than a month. It would be highly desirable to have available a more simple test method that can be performed in a shorter period of time.

The present invention provides a test methodology for Metal-Insulator-Metal (MIM) capacitor that uses a novel test structure to heat the MIM capacitors locally to high temperature at the wafer level.

FIG. 1 shows an embodiment of a test structure 100 that can be used in practicing the present invention. In the test structure 100 shown in FIG. 1, a Metal-Insulator-Metal (MIM) capacitor structure, generally identified by the dotted line oval 102 in FIG. 1, is located between the upper metal layer of an integrated circuit structure, shown as metal layer five (M5) in FIG. 1, and the metal layer of the illustrated integrated circuit structure that is formed immediately below M5, i.e., metal layer four (M4) in the FIG. 1 embodiment. Of course, those skilled in the art will appreciate that the use of the M5 and M4 metal layers of the integrated circuit structure for the upper and lower plates of the MIM capacitor 102 in the FIG. 1 structure is intended to be illustrative of the concepts of the invention and not limiting; the utilization of other metal layers within the integrated circuit structure to form the MIM capacitor, including metal layers that are not necessarily formed sequentially in the overall process flow, is contemplated as being within the scope of the present invention. The MIM capacitor structure 102 can be formed between any two metal layers in the overall device structure. When upper metal levels are used for the MIM structure 102, the capacitor is further from the silicon substrate and, thus, the Q-factor is increased due to less parasitic capacitance and lower metal sheet resistance.

While those skilled in the art will appreciate that a variety of well known process techniques can be utilized in fabricating the MIM structure 102, the following is an example of one process sequence that can be used: The bottom plate metal (M4 in the FIG. 1 embodiment) is deposited in the conventional manner. Capacitor dielectric film (e.g., PETOS, PECVD, silane-based silicon dioxide, silicon nitride) is deposited on the bottom metal. The capacitor top metal is then deposited and photolithographically defined. The defined capacitor top metal acts as the top plate for the MIM capacitor 102. The capacitor top metal is etched using highly-selective metal/oxide chemistry that stops on the capacitor dielectric. After stripping the photoresist used in the capacitor top metal etch step, the bottom plate metal is patterned to define the bottom plate of the MIM capacitor, the M4 thermometer and interconnects. An interlayer dielectric material (e.g., silicon dioxide) is then deposited and planarized, e.g., using chemical mechanical polishing (CMP). Standard via mask and etch process steps are then performed. Finally, an interconnect layer is deposited, patterned and etched to form the external connections to the top and bottom plates of the MIM structure 102.

As further shown in FIG. 1, a polysilicon resistor 104 is formed beneath the MIM capacitor 102 and directly on top of field oxide isolation, shown in FIG. 1 as a shallow trench isolation oxide structure 106. The shallow trench isolation oxide 106 is formed in a semiconductor substrate 108, e.g., silicon (Si), in the conventional manner. The polysilicon resistor 104 is insulated from the MIM capacitor structure 102 by intervening dielectric material 110, e.g. silicon dioxide. A metal plate 112 is formed adjacent to the MIM capacitor 102 and above the polysilicon heater 104. In the FIG. 1 embodiment, the metal plate 112 is formed from the M4 metal layer, i.e., the same metal layer used to form the lower plate of the MIM capacitor 102, when the M4 metal layer is patterned in the general process flow.

In a test methodology in accordance with the invention, high current is forced through the polysilicon resistor 104 to heat the poly resistor 104. The metal plate 112 formed adjacent to the MIM capacitor 102 and above the poly heater 104 is used as a thermometer to monitor the heat generated by the poly heater 104. With change in temperature, the resistance of the metal plate 112 varies. By using the known Temperature Coefficient of Resistance (TCR) values for the metal plate 112, the change in metal resistance of the metal plate 112 can be translated into the actual temperature of the metal plate 112. Since the lower M4 plate of the MIM capacitor 102 is located in close proximity to the M4 metal plate 112, and over the same poly heater 104, the MIM capacitor 102 will be at substantially the same temperature as the metal plate 112.

The resistance of the metal thermometer is measured as follows: The poly resistor 104 is heated by independent electrical control. The resistance of the M4 thermometer 112 is measure independently using a conventional 4-point probe method. Two opposite terminals are used to force small current and two other terminals are used to measure voltage. The resistance of the metal line is calculated from this test.

The complete methodology for measuring TCR and temperature of the metal line is provided in the JEDEC document "Standard Method for Measuring and Using the Temperature Coefficient of Resistance to Determine the Temperature of a Metallization Line", JESD33B (Revision of JESD33-A), February 2004.

Reliability (voltage stress) testing of the MIM capacitor 102 can be done at any temperature ranging from room temperature to 400 C. by varying the current forced into the poly resistor 104.

By increasing the temperature and by performing the test at the wafer level, rather than at the packaged die level, as is the current practice, the reliability test time can be reduced from several weeks to several hours. Not having to package the capacitors also saves a significant amount in assembly costs. This test also provides faster feedback to the process engineers in the fabrication sequence to enable the process to be modified if there are reliability issues associated with the MIM capacitor design.

Those skilled in the art will appreciate that the MIM capacitor test structure 100 shown in FIG. 1 can be fabricated utilizing conventional integrated circuit process modules in a conventional manner. However. It should also be clear, given the novel nature of the MIM capacitor testing structure, that the combined sequence of process steps utilized to fabricate a testing structure 100 is also considered to be within the scope of the present invention.

It should also be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A test system for testing a metal-insulator-metal (MIM) capacitor, the test system comprising:
   (a) an integrated circuit structure that includes
      (i) a resistor formed on a region of dielectric material that is formed on an upper surface of a semiconductor substrate;
      (ii) a MIM capacitor structure, having space-apart upper and lower plates formed of conductive, the MIM capacitor structure being formed over the resistor and separated therefrom by intervening dielectric material; and
      (iii) a metal thermometer plate formed utilizing the same conductive material as the upper and lower plates of the MIM capacitor structure, the thermometer plate being formed over the resistor and in close proximity to the MIM capacitor structure; and
   (b) a resistance monitor that is electrically connectable to the thermometer plate for measuring changes in resistance of the thermometer plate with changes in the temperature of the thermometer plate.

2. A test structure as in claim 1, and wherein the resistor comprises polysilicon formed on a region of silicon oxide formed on an upper surface of a silicon substrate.

3. A test structure as in claim 1, and wherein the MIM capacitor structure comprises a top metal plate and a bottom metal plate, the top metal plate being separated from the lower metal plate by intervening silicon dioxide.

4. A test structure as in claim 1, and wherein the thermometer plate comprises the same metal material utilized to form the lower plate of the MIM capacitor structure.

* * * * *